United States Patent
Myoung et al.

(10) Patent No.: US 10,361,735 B2
(45) Date of Patent: Jul. 23, 2019

(54) NFC RECEIVER AND OPERATION METHOD OF CIRCUIT COMPRISING THE NFC RECEIVER

(71) Applicant: SAMSUNG ELECTRONICS CO., LTD., Suwon-si (KR)

(72) Inventors: Seong-sik Myoung, Suwon-si (KR); Jun-ho Kim, Yongin-si (KR); Il-jong Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/604,918

(22) Filed: May 25, 2017

(65) Prior Publication Data

US 2018/0123627 A1  May 3, 2018

(30) Foreign Application Priority Data

Oct. 28, 2016  (KR) .......... 10-2016-0142145

(51) Int. Cl.
*H04B 1/10* (2006.01)
*H02J 50/12* (2016.01)
(Continued)

(52) U.S. Cl.
CPC .......... *H04B 1/1036* (2013.01); *H02J 3/01* (2013.01); *H02J 50/12* (2016.02); *H03G 3/20* (2013.01);
(Continued)

(58) Field of Classification Search
CPC ....... H04B 1/1036; H04B 5/0025; H03G 3/20
(Continued)

(56) References Cited

U.S. PATENT DOCUMENTS 6,778,345 B1 * 8/2004 Ozdemir .......... G11B 20/10009
360/66
8,428,535 B1 * 4/2013 Cousinard .......... A42B 3/225
455/226.2

(Continued)

FOREIGN PATENT DOCUMENTS

| KR | 10-1339691 B1 | 12/2013 |
| KR | 10-1471806 B1 | 12/2014 |
| WO | 2010/029445 A1 | 3/2010 |

OTHER PUBLICATIONS

Communication dated Mar. 28, 2018 issued by the European Patent Office in counterpart European Patent Application No. 17196363.0.

*Primary Examiner* — Ayodeji O Ayotunde
(74) *Attorney, Agent, or Firm* — Sughrue Mion, PLLC

(57) ABSTRACT

A method of operating a near-field communication (NFC) circuit, the method including: receiving an interference signal and a data signal through an antenna; adjusting magnitudes of the received interference signal and the received data signal; down-converting frequencies of the interference signal and the data signal, the magnitudes of which are adjusted; filtering the data signal by removing the frequency down-converted interference signal; and adjusting a magnitude of the filtered data signal. The adjusting of the magnitudes of the received interference signal and the received data signal may include adjusting the magnitudes of the interference signal and the data signal such that linearity of the data signal is maintained during signal processing performed on the interference signal and the data signal in the down-converting of the frequencies of the interference signal and the data signal, the filtering of the data signal, and the adjusting of the magnitude of the filtered data signal.

19 Claims, 15 Drawing Sheets

(51) Int. Cl.
  *H02J 3/01*   (2006.01)
  *H03G 3/20*   (2006.01)
  *H04B 5/00*   (2006.01)

(52) U.S. Cl.
  CPC ......... *H04B 5/0025* (2013.01); *H04B 5/0075* (2013.01)

(58) Field of Classification Search
  USPC ........................................................ 455/41.1
  See application file for complete search history.

(56) References Cited

U.S. PATENT DOCUMENTS

| | | |
|---|---|---|
| 8,946,939 B2 | 2/2015 | Drennen |
| 8,983,374 B2 | 3/2015 | Wiley |
| 9,240,824 B2 | 1/2016 | Hillan et al. |
| 2010/0190436 A1 | 7/2010 | Cook et al. |
| 2015/0087228 A1 | 3/2015 | Porat et al. |
| 2016/0006290 A1* | 1/2016 | Ho ........................ H02J 7/0044 320/108 |
| 2016/0028446 A1 | 1/2016 | Moon et al. |
| 2016/0248459 A1* | 8/2016 | Gan ........................ H04B 1/109 |

* cited by examiner

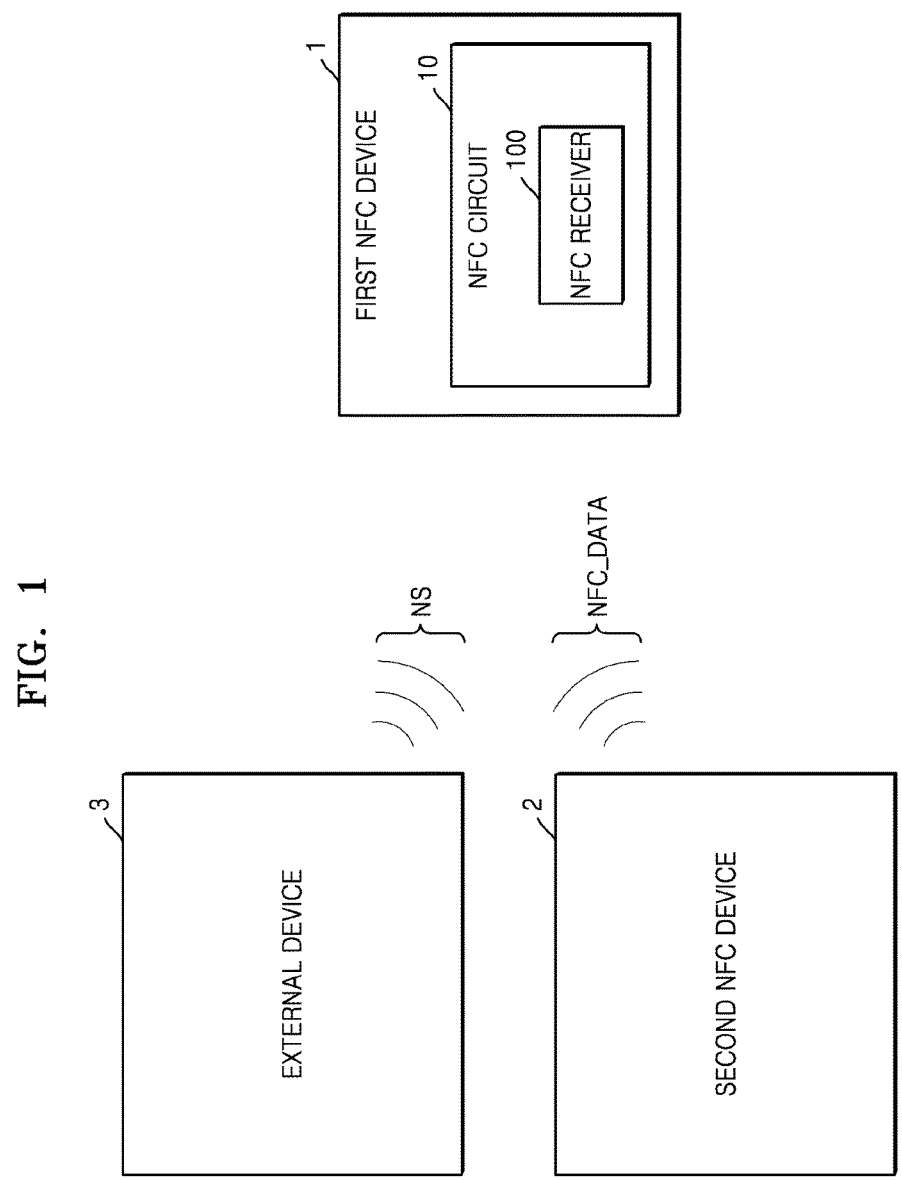

NFC RECEIVER AND OPERATION METHOD OF CIRCUIT COMPRISING THE NFC RECEIVER

CROSS-REFERENCE TO RELATED APPLICATION

This application claims priority from Korean Patent Application No. 10-2016-0142145, filed on Oct. 28, 2016, in the Korean Intellectual Property Office, the disclosure of which is incorporated herein in its entirety by reference.

BACKGROUND

1. Field

The inventive concept relates to Near Field Communication (NFC), and more particularly, to an NFC receiver and a method of operating a circuit including the NFC receiver.

2. Description of the Related Art

NFC is a wireless communication technology. Wireless communication systems, to which NFC is applied, may both write and read data, and have a relatively short communication range. The NFC systems can be also inexpensive and highly secure.

However, when an NFC system is implemented in a wireless power transmission system, a strong signal of the wireless power transmission system may act as an interference signal to the NFC system, resulting in saturation of an NFC receiver or deterioration of sensitivity. Accordingly, there exists a need to minimize interference and performance deterioration from an interference signal such as a wireless power transmission signal.

SUMMARY

One or more exemplary embodiments provide an NFC receiver having an improved signal-to-noise ratio (SNR) and a method of operating an NFC circuit including the NFC receiver.

According to an aspect of an exemplary embodiment, there is provided a method of operating a near-field communication (NFC) circuit. The method may include: receiving an interference signal and a data signal through an antenna; adjusting magnitudes of the received interference signal and the received data signal; down-converting frequencies of the interference signal and the data signal, the magnitudes of which are adjusted; filtering the data signal by removing the frequency down-converted interference signal; and adjusting a magnitude of the filtered data signal. The adjusting of the magnitudes of the received interference signal and the received data signal may include adjusting the magnitudes of the interference signal and the data signal are adjusted such that linearity is maintained during signal processing performed on the interference signal and the data signal in the down-converting of the frequencies of the interference signal and the data signal, the filtering of the data signal, and the adjusting of the magnitude of the filtered data signal.

According to an aspect of an exemplary embodiment, a method of operating a near-field communication (NFC) circuit may include: receiving a first signal including an interference signal or a data signal through an antenna; attenuating a magnitude of the received first signal; down-converting a frequency of the first signal having the attenuated magnitude based on a local oscillation signal having a frequency for communication of the NFC circuit; filtering the data signal included in the frequency down-converted first signal; and adjusting a magnitude of the filtered data signal. The attenuating of the magnitude of the received first signal may include attenuating the magnitude of the first signal such that linearity of the data signal is maintained in signal processing performed on the first signal in the down-converting of the frequency of the first signal, the filtering of the data signal, and the adjusting of the magnitude of the filtered data signal. The adjusting of the magnitude of the filtered data signal may include adjusting the magnitude of the filtered data signal such that the filtered data signal has a sufficient magnitude for demodulating without saturation.

According to an aspect of an exemplary embodiment, a near-field communication (NFC) receiver performing communication with the outside through an antenna may include: a first adjusting unit configured to receive a data signal or an interference signal through the antenna and attenuate magnitudes of the data signal or the interference signal based on a first attenuation value; a mixer configured to down-convert frequencies of the data signal or the interference signal output by the first adjusting unit; a filter configured to filter the interference signal from the data signal output by the mixer; a second adjusting unit configured to receive the filtered data signal and amplify or attenuate a magnitude of the data signal based on a first gain value; and an automatic gain controller (AGC) configured to adjust the first attenuation value based on the magnitude of the data signal or the interference signal that is attenuated using the first adjusting unit, and to adjust the first gain value based on the magnitude of the data signal that is amplified or attenuated using the second adjusting unit.

BRIEF DESCRIPTION OF THE DRAWINGS

The above and/or other aspects will be more clearly understood from the following detailed description taken in conjunction with the accompanying drawings in which:

FIG. 1 illustrates a near-field communication (NFC) environment according to an exemplary embodiment;

DETAILED DESCRIPTION OF THE EMBODIMENTS

Figure 2A:
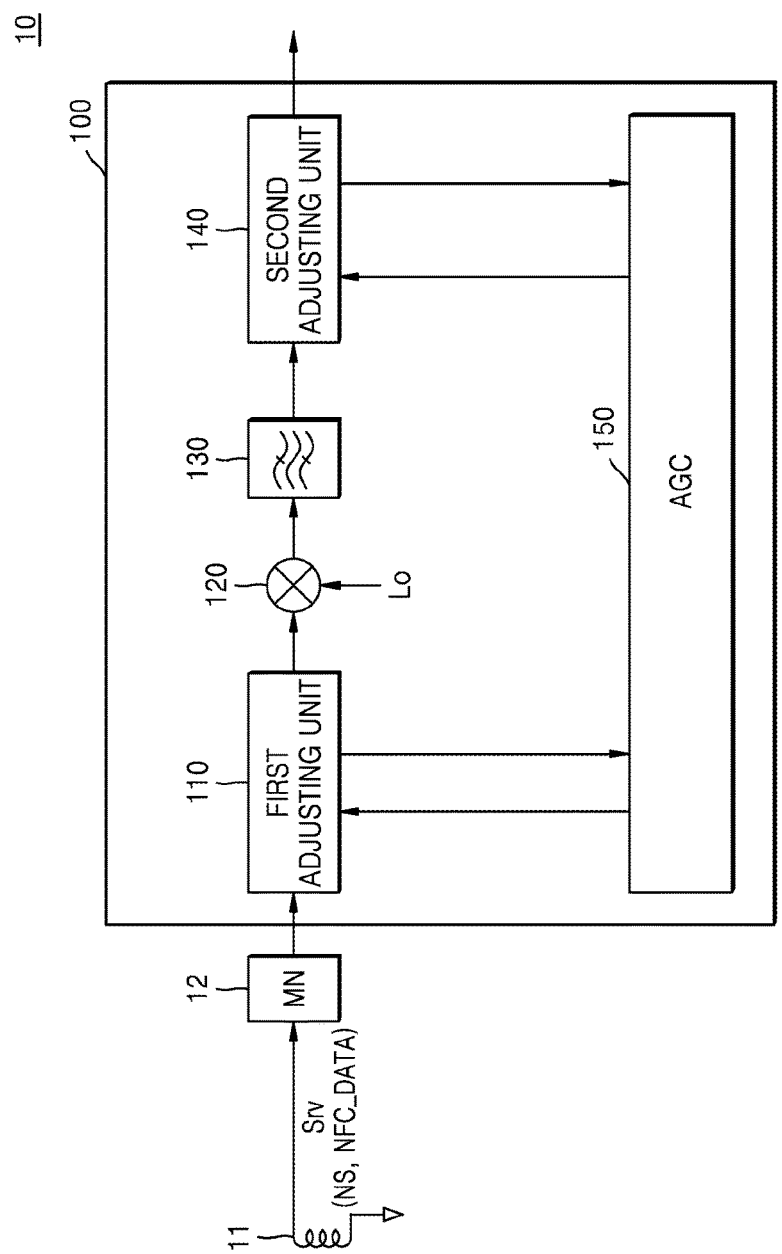
FIG. 2A is a block diagram of an NFC circuit according to an exemplary embodiment.

FIG. 1 illustrates a near-field communication (NFC) environment according to an exemplary embodiment.

As shown in FIG. 1, in the NFC environment, wireless communication of information such as at least one command and/or data may be provided between a first NFC device 1 and a second NFC device 2 in sufficient mutual proximity. The first NFC device 1 and the second NFC device 2 may be each implemented as an independent or individual device. However, the first NFC device 1 and the second NFC device 2 are not limited thereto, and may also be mounted in or coupled to another electronic device such as a smartphone, a portable calculator, a personal digital assistant (PDA), a laptop, a desktop computer, a computer peripheral device (e.g., a printer, a portable audio or video player), a payment system, or a ticket issuing system.

The first NFC device 1 and the second NFC device 2 may interact with each other in a peer-to-peer (P2P) communication mode, a reader/writer (R/W) communication mode, or a card emulation mode in order to exchange information. In a P2P communication mode, the first NFC device 1 and the second NFC device 2 may be configured to operate according to an active communication mode and/or a passive communication mode. In an R/W communication mode, the first NFC device 1 and the second NFC device 2 may be configured to operate in half duplex mode, in which the first NFC device 1 operates in a reader mode and the second NFC device 2 operates in a tag mode, or vice versa. In a card emulation mode, the first NFC device 1 and/or the second NFC device 2 may operate, for example, as radio frequency identification (RFID) cards.

The second NFC device 2 may transmit a data signal NFC_DATA to the first NFC device 1. The data signal NFC_DATA may be a modulated signal. In an exemplary embodiment, a data signal NFC_DATA may be an Amplitude Shift Keying (ASK)-modulated signal. According to another exemplary embodiment, a data signal NFC_DATA may be a Frequency Shift Keying (FSK)-, Phase Shift Keying (PSK)-, Quadrature Phase Shift Keying (QPSK)- or Orthogonal Frequency Division Multiplexing (OFDM)-modulated signal.

The first NFC device 1 may include an NFC circuit 10, and the NFC circuit 10 may include an NFC receiver 100. The NFC circuit 10 may include an antenna, a matching network, an NFC transmitter, an NFC card circuit or a processor.

In an NFC environment, while the first NFC device 1 receives a data signal NFC_DATA from the second NFC device 2, the first NFC device 1 may further receive an interference signal NS. The interference signal NS may also be generated by an external device 3 to the first NFC device 1.

The interference signal NS may have a greater magnitude than the data signal NFC_DATA. The interference signal NS may include, for example, a wireless power transmission signal output from a wireless power transmission system. The interference signal NS may include a plurality of harmonics. According to an exemplary embodiment, one of the harmonics of the interference signal NS may have the same frequency as a frequency for communication of the NFC receiver 100. According to an aspect of an exemplary embodiment, harmonics of the interference signal NS may each have a different frequency from a frequency for communication of the NFC receiver 100. A frequency for communication of the NFC receiver 100 may be, for example, a carrier frequency of NFC.

According to an aspect of an exemplary embodiment, while the first NFC device 1 receives a data signal NFC_DATA from the second NFC device 2, if an interference signal NS is further received from the external device 3, the NFC circuit 10 including the NFC receiver 100 may perform operations such as adjusting the magnitudes of the data signal NFC_DATA and the interference signal NS, frequency conversion or filtering on the data signal NFC_DATA and the interference signal NS. These operations will be further described in detail below with reference to FIGS. 2A and 2B.

Figure 2B:
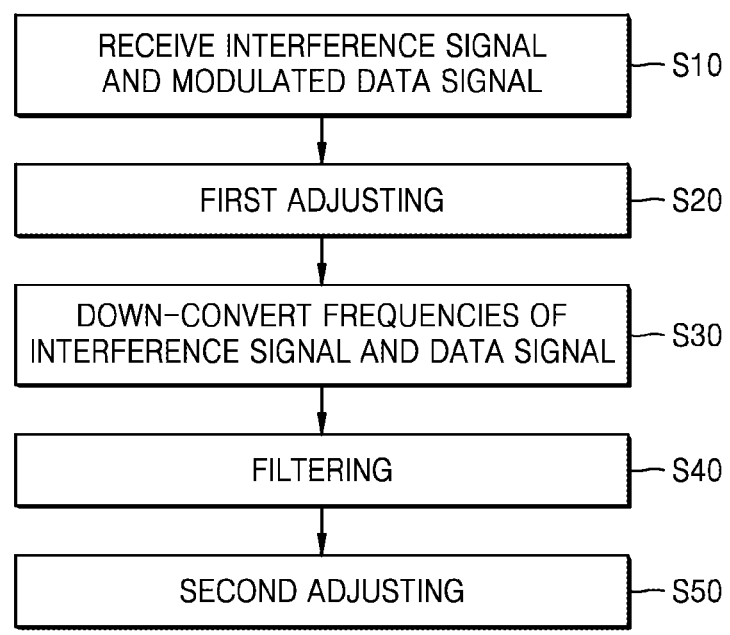
FIG. 2B is a flowchart of an operation of the NFC circuit according to an exemplary embodiment.

FIG. 2A is a block diagram of an NFC circuit 10 according to an exemplary embodiment, and FIG. 2B is a flowchart of an operation of the NFC circuit 10 according to an exemplary embodiment.

As shown in FIG. 2A, the NFC circuit 10 may include an antenna 11, a matching network 12, and an NFC receiver 100.

The antenna 11 may convert a wireless signal received from the outside, into an electric signal, and output the electric signal to the NFC receiver 100. According to an aspect of an exemplary embodiment, the antenna 11 may receive a data signal NFC_DATA or an interference signal NS from the outside and convert the same into an electric signal Srv and output the same to the NFC receiver 100. The antenna 11 may convert the electric signal output from the NFC circuit 10, into a wireless signal, and output the same to the outside. The antenna 11 may be, for example, a case-type or a battery-type antenna.

The matching network 12 may be connected between the antenna 11 and the NFC receiver 100. The matching network 12 may adjust a resonance frequency of the antenna 11 and match impedance in a direction towards the NFC receiver 100 with impedance in a direction towards the antenna 11 so as to increase communication efficiency of the NFC receiver 100. For example, the matching network 12 may include a resonator and a matching unit.

The NFC receiver 100 may communicate with the outside of the NFC circuit 10 through an antenna, for example, with an external NFC circuit or an NFC tag. According to an aspect of an exemplary embodiment, along with an NFC transmitter, the NFC receiver 100 may constitute an NFC reader circuit. The NFC receiver 100 may include a first adjusting unit 110, a mixer 120, a filter 130, a second adjusting unit 140, and an automatic gain controller (AGC) 150.

The first adjusting unit 110 may adjust the magnitudes of the interference signal NS and the data signal NFC_DATA received through the antenna 11. Specifically, the first adjusting unit 110 may attenuate the magnitudes of the interference signal NS and the data signal NFC_DATA such that signal linearity is maintained in a signal processing operation performed on the interference signal NS and the data signal NFC_DATA, by the mixer 120, the filter 130, and the second adjusting unit 140. According to an aspect of an exemplary embodiment, the first adjusting unit 110 may detect the magnitude of the interference signal NS or the data signal NFC_DATA, and attenuate the interference signal NS or the data signal NFC_DATA according to a first attenuation value that varies based on the detected signal magnitude. The first attenuation value may be varied by using the AGC 150.

The mixer 120 may down-convert a frequency of the interference signal NS and/or the data signal NFC_DATA, the magnitude of which is adjusted using the first adjusting unit 110. The mixer 120 may mix the interference signal NS or the NFC_DATA with a local oscillation signal Lo. The local oscillation signal Lo may be output to the mixer 120 via a local oscillator, but is not limited thereto. According to an exemplary embodiment, the local oscillation signal Lo may have the same frequency as a frequency for communication of the NFC receiver 100. The frequency for communication of the NFC receiver 100 may be, for example, a carrier frequency of the data signal NFC_DATA.

The filter 130 may receive the interference signal NS and the data signal NFC_DATA, frequencies of which are down-converted using the mixer 120, and remove the interference signal NS and filter the data signal NFC_DATA. The filter 130 may include a high pass filter and/or a band pass filter. According to an aspect of an exemplary embodiment, when one of the harmonics of the interference signal NS has the same frequency as a frequency for communication of the NFC receiver 100, the interference signal NS may be removed using the high pass filter and/or the band pass filter included in the filter 130. According to an exemplary embodiment, if each of the harmonics of the interference signal NS has a different frequency from a frequency for communication of the NFC receiver 100, the interference signal NS may be removed through the band pass filter included in the filter 130.

The second adjusting unit 140 may adjust the magnitude of the data signal NFC_DATA that has passed through the filter 130. Specifically, the second adjusting unit 140 may amplify or attenuate the data signal NFC_DATA such that the filtered data signal NFC_DATA has a magnitude that is sufficient to be normally demodulated. According to an aspect of an exemplary embodiment, the second adjusting unit 140 may detect the magnitude of the data signal NFC_DATA, and may amplify or attenuate the data signal NFC_DATA based on a first gain value that varies according to the detected signal magnitude. The first gain value may be varied using the AGC 150.

The AGC 150 may control the first attenuation value of the first adjusting unit 110 and the first gain value of the second adjusting unit 140. Specifically, the AGC 150 may control the first attenuation value based on the magnitudes of the data signal NFC_DATA and/or the interference signal NS detected using the first adjusting unit 110, and control the first gain value based on the magnitude of the data signal NFC_DATA detected using the second adjusting unit 140. According to an exemplary embodiment, the AGC 150 may include a table and control the first attenuation value or the first gain value by comparing magnitudes of signals detected using the first adjusting unit 110 and/or the second adjusting unit 140 with values of the table.

In regard to an operation on the NFC circuit 10 according to an aspect of an exemplary embodiment with reference to FIGS. 2A and 2B, first, an interference signal NS and a modulated data signal NFC_DATA may be received through the antenna 11 in operation S10. According to an aspect of an exemplary embodiment, the data signal NFC_DATA may be ASK-modulated. According to an aspect of an exemplary embodiment, the interference signal NS may have a greater magnitude than the data signal NFC_DATA. The interference signal NS may be, for example, a wireless power transmission signal output from a wireless power transmission system.

In operation S20, a first adjusting operation may be performed on the interference signal NS and the data signal NFC_DATA received through the antenna 11. The first adjusting operation (S20) may be performed using the first adjusting unit 110 that has received the interference signal NS and the data signal NFC_DATA through the matching network 12. However, exemplary embodiments of the present disclosure are not limited thereto, and the NFC circuit 10 may also immediately receive the interference signal NS and the data signal NFC_DATA through the antenna 11. In the first adjusting operation (S20), magnitudes of the interference signal NS and the data signal NFC_DATA may be adjusted such that signal linearity is maintained in a signal processing operation performed on the interference signal NS and the data signal NFC_DATA, by using the mixer 120, the filter 130, and the second adjusting unit 140. According to an exemplary embodiment, in the first adjusting operation S20, magnitudes of the received interference signal NS and the received data signal NFC_DATA may be attenuated, and the attenuated magnitudes of the interference signal NS and the data signal NFC_DATA may be detected, and then whether signal linearity is maintained or not may be determined based on the detected signal magnitudes to adjust a degree of attenuation with respect to the received interference signal NS and the received data signal NFC_DATA. According to an exemplary embodiment, the first adjusting operation (S20) may be performed based on the table included in the AGC 150.

In operation S30, frequencies of the interference signal NS and the data signal NFC_DATA, magnitudes of which are adjusted in the first adjusting unit (S20), may be down-converted. Operation S30 may be performed using the mixer 120. The mixer 120 may perform frequency down-conversion on the interference signal NS and the data signal NFC_DATA based on a local oscillation signal Lo output from a local oscillator. According to an aspect of an exemplary embodiment, the local oscillation signal Lo input to the mixer 120 may have the same frequency as a frequency for communication of the NFC receiver 100.

In the frequency down-conversion operation S30, the interference signal NS and the data signal NFC_DATA may be separated from each other in a frequency domain. According to an exemplary embodiment, after operation S30, the data signal NFC_DATA may have a frequency component in band-pass form that is carried on a sub-carrier frequency (or intermediate frequency $f_{IF}$), and the interference signal NS may include a DC component. According to an aspect of an exemplary embodiment, after operation S30, the interference signal NS may be converted not into a DC component but into a frequency corresponding to a difference between a frequency of each of the harmonics of the interference signal NS and a frequency of a local oscillation signal Lo. For example, harmonics of the frequency down-converted interference signal NS may exist both in a low frequency domain and a high frequency domain of the data signal NFC_DATA that has the down-converted frequency.

In operation S40, a filtering operation may be performed on the interference signal NS and the data signal NFC_DATA respectively having down-converted frequencies. The filtering operation (S40) may be performed using the filter 130. According to an aspect of an exemplary embodiment, when one of the harmonics of the interference signal NS has the same frequency as a frequency for communication of the NFC receiver 100, high pass filtering or band pass filtering may be performed in the filtering operation (S40). According to an exemplary embodiment, when each of the harmonics of the interference signal NS has a different frequency from a frequency for communication of the NFC receiver 100, band pass filtering may be performed in the filtering operation (S40).

In operation S50, a second adjusting operation may be performed on the data signal NFC_DATA that has undergone the filtering operation (S40). The second adjusting operation (S50) may be performed using the second adjusting unit 140. In the second adjusting operation (S50), a magnitude of the filtered data signal NFC_DATA may be adjusted such that the filtered data signal NFC_DATA has a sufficient magnitude in order to be normally demodulated. According to an aspect of an exemplary embodiment, the second adjusting operation S50 may include: amplifying or attenuating a magnitude of the filtered data signal NFC_DATA; performing analog-to-digital conversion on the amplified (or attenuated) data signal NFC_DATA; detecting a magnitude of the analog-to-digital converted data signal NFC_DATA; determining whether the data signal NFC_DATA may be normally demodulated based on the detected signal magnitude; and adjusting a degree of amplification of the filtered data signal NFC_DATA based on the determination. According to an aspect of an exemplary embodiment, the second adjusting operation (S50) may be performed based on the table included in the AGC 150.

As described above, by using a simple structure, the NFC circuit 10 may minimize mutual interference and performance deterioration caused by the interference signal NS. In addition, if the interference signal NS includes a wireless power transmission signal, there is no need to reduce transmission power of a wireless power transmission system, from which the wireless power transmission signal is generated, and thus, a wireless power transmission period and efficiency may be improved.

Figure 3A:
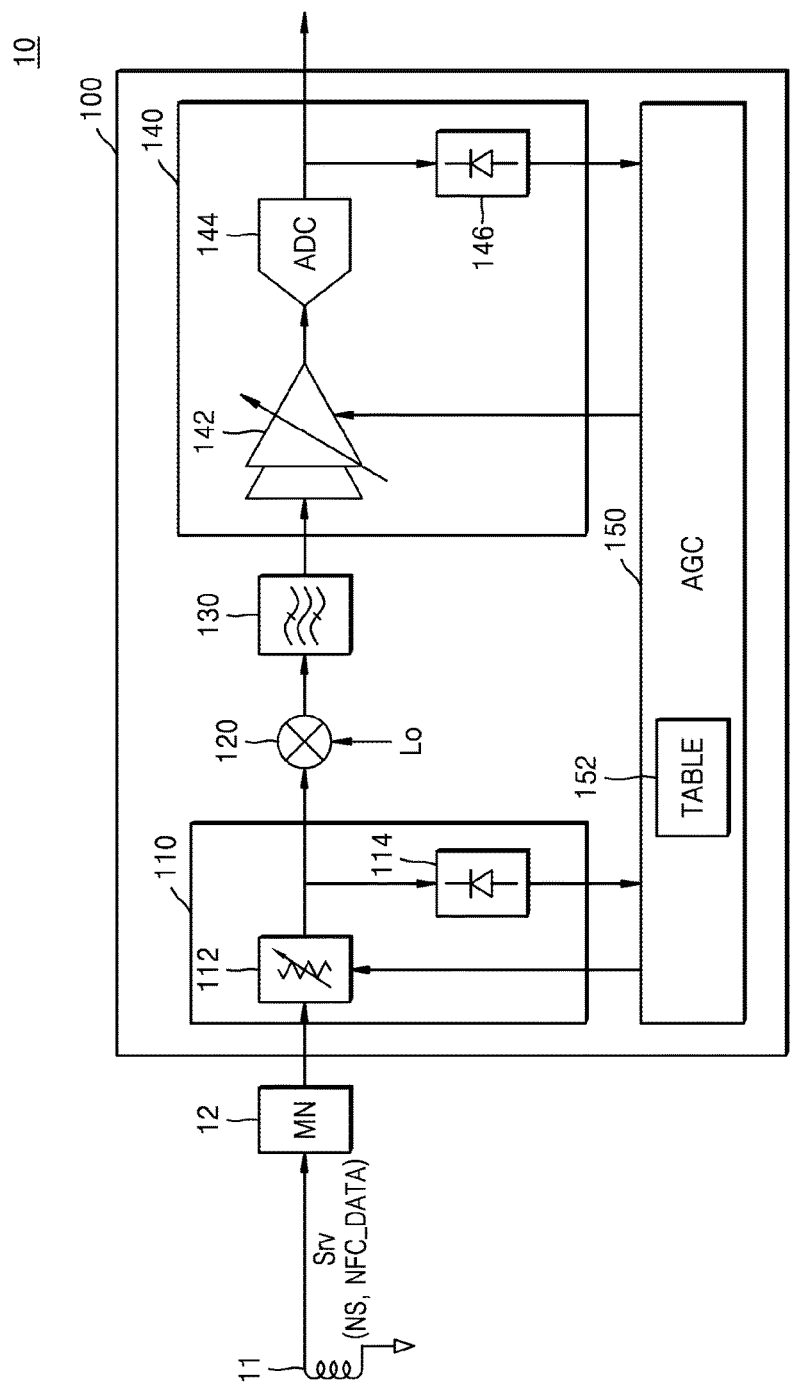
FIG. 3A is a detailed block diagram of an NFC circuit according to an exemplary embodiment.
Figure 3B:
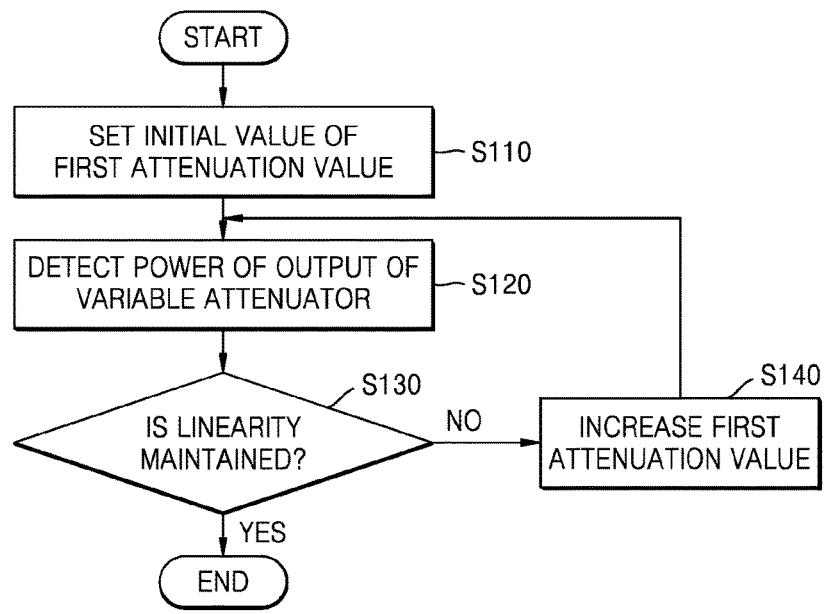
FIGS. 3B and 3C are flowcharts of an example of an operation of the NFC receiver illustrated in FIG. 3A.
Figure 3C:
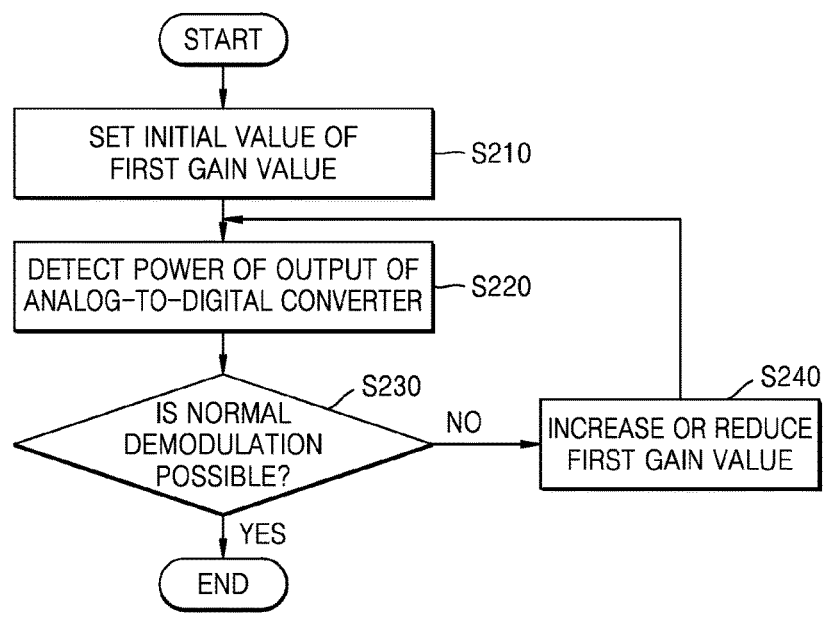

FIG. 3A is a detailed block diagram of an NFC circuit 10 according to an exemplary embodiment, and FIGS. 3B and 3C are flowcharts of an example of an operation of an NFC receiver illustrated in FIG. 3A.

As shown in FIG. 3A, the first adjusting unit 110 may include a variable attenuator 112 and a first power detector 114, and the second adjusting unit 140 may include a variable gain amplifier 142, an analog-to-digital converter 144, and a second power detector 146, and the AGC 150 may include a first table 152.

The variable attenuator 112 may attenuate a magnitude of a data signal NFC_DATA or an interference signal NS received through an antenna 11, based on a first attenuation value. The first attenuation value may be controlled using the AGC 150 and may be variable. According to an aspect of an exemplary embodiment, the variable attenuator 112 may include a plurality of switches and a plurality of resistors. According to another exemplary embodiment, the variable attenuator 112 may include a plurality of switches and a plurality of capacitors. However, the variable attenuator 112 is not limited thereto and may have diverse configurations.

The first power detector 114 may detect power with respect to a signal between the variable attenuator 112 and the mixer 120. The first power detector 114 may include, for example, a plurality of power conversion circuits, and may combine a plurality of currents from the plurality of power conversion circuits to determine an output. An output of the first power detector 114 may be a current or a voltage. The first power detector 114 may output power detection information regarding the signal between the variable attenuator 112 and the mixer 120, to the AGC 150.

The variable gain amplifier 142 may amplify or attenuate the data signal NFC_DATA filtered using the filter 130, based on a first gain value. The first gain value may be controlled using the AGC 150. The analog-to-digital converter 144 may perform analog-to-digital conversion on the data signal NFC_DATA that is amplified or attenuated based on the first gain value.

The second power detector 146 may detect power with respect to an output signal that is converted into a digital signal by using the analog-to-digital converter 144. A signal, power of which is detected using the second power detector 146, may be a digital signal. The second power detector 146 may include, for example, a plurality of current conversion circuits, and combine a plurality of currents from the plurality of current conversion circuits to determine an output voltage. The second power detector 146 may output power detection information regarding the output signal that is converted into a digital signal and output by the analog-to-digital converter 144, to the AGC 150.

The first table 152 may include information about first and/or second levels and information about at least one of the first attenuation value and the second gain value. According to an aspect of an exemplary embodiment, the first level may be compared with an output signal of the first power detector 114, and may be an index for determining whether signal linearity is to be maintained, in a signal processing operation performed on the interference signal NS and the data signal NFC_DATA, by the mixer 120, the filter 130, and the second adjusting unit 140. The second level may be compared with an output signal of the second power detector 146 and used as an index for determining whether the data signal NFC_DATA has a sufficient magnitude in order to be demodulated normally.

An example of an operation of adjusting a first attenuation value, performed by the first adjusting unit 110 and the AGC 150 illustrated in FIG. 3A, will be described with reference to FIG. 3B.

First, an initial value of the first attenuation value, which is a measure of attenuation of the variable attenuator 112, may be set in operation S110. The initial value may be set, for example, by using the AGC 150 or a processor. According to an exemplary embodiment, the initial value of the first attenuation value may be set to a minimum attenuation value.

Next, power regarding an output of the variable attenuator 112 based on the first attenuation value set to the initial value may be detected in operation S120. The power regarding an output of the variable attenuator 112 may be detected using the first power detector 114, and the detected value may be input to the AGC 150.

Whether linearity is maintained may be determined based on the detected power regarding the output of the variable attenuator 112 in operation S130. According to an aspect of an exemplary embodiment, linearity may refer to linearity of a signal in a signal processing operation performed by the mixer 120, the filter 130, and the second adjusting unit 140, based on the attenuated data signal NFC_DATA or the attenuated interference signal NS. If linearity is not maintained, the mixer 120, the filter 130 or the second adjusting unit 140 may be saturated by the data signal NFC_DATA or the interference signal NS. According to an exemplary embodiment, whether linearity is maintained or not may be determined by comparing power regarding an output of the variable attenuator 112 input to the AGC 150 with a first level stored in a first table 152.

When it is determined that linearity is not maintained in an operation of determining whether linearity is maintained, the AGC 150 may increase the first attenuation value in operation S140. According to an aspect of an exemplary embodiment, information about the first attenuation value may be stored in the first table 152. The AGC 150 may transmit a control signal regarding the first attenuation value to the variable attenuator 112, and the variable attenuator 112 may attenuate the data signal NFC_DATA and the interference signal NS to the first attenuation value varied based on the control signal. The control signal of the AGC 150 may control, for example, whether to turn on or off a switch connected to a resistor included in the variable attenuator 112.

When it is determined that linearity is maintained in an operation of determining whether linearity is maintained, adjustment of the first attenuation value may be ended. According to an exemplary embodiment, if it is determined that linearity is maintained, the attenuated data signal NFC_DATA and the attenuated interference signal NS may be input to the mixer 120.

FIG. 3C illustrates an example of adjusting a first gain value, performed by the second adjusting unit 140 and the AGC 150 illustrated in FIG. 3A.

First, in operation S210, an initial value of the first gain value, which is a measure of amplification of the variable gain amplifier 142, may be set. The initial value may be set, for example, by the AGC 150 or a processor. According to an aspect of an exemplary embodiment, when the initial value of the first attenuation value is set to a minimum attenuation value, the first gain value may be set, based on the minimum attenuation value, to a value that is predictable to ensure an optimum SNR.

Next, power regarding an output of the analog-to-digital converter 144 may be detected in operation S220. The output of the analog-to-digital converter 144 may be an output of the analog-to-digital converter 144 regarding the data signal NFC_DATA that is amplified or attenuated using the variable gain amplifier 142 based on the first gain value.

In operation S230, whether the data signal NFC_DATA may be normally demodulated may be determined based on the detected power regarding the output of the analog-to-digital converter 144. According to an exemplary embodiment, whether normal demodulation is possible or not may be determined by comparing power regarding an output of the analog-to-digital converter 144 input to the AGC 150 with a second level stored in the first table 152.

When it is determined that the data signal NFC_DATA is not able to be normally demodulated in an operation of determining whether normal demodulation is possible, the AGC 150 may increase or reduce the first gain value in operation S240. According to an exemplary embodiment, information about the first gain value may be stored in the first table 152. The AGC 150 may transmit a control signal regarding the first gain value to the variable gain amplifier 142, and the variable gain amplifier 142 may amplify or attenuate the data signal NFC_DATA by using the first gain value varied based on the control signal.

When it is determined that the data signal NFC_DATA is able to be normally demodulated, adjustment of the first gain value may be ended. According to an aspect of an exemplary embodiment, when it is determined that normal demodulation is possible, the amplified data signal NFC_DATA may be input to a demodulator.

Figure 4A:
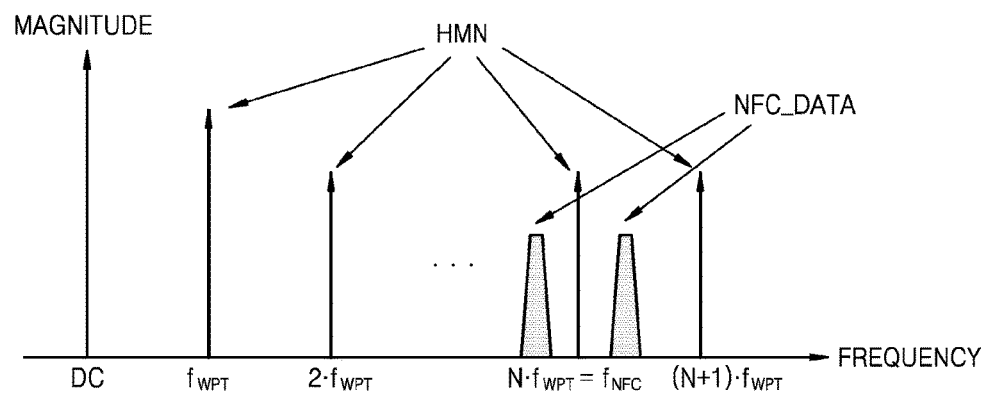
FIGS. 4A through 4C illustrate a frequency spectrum of each signal when one of the harmonics of an interference signal has the same frequency as a frequency for communication of an NFC receiver, according to an exemplary embodiment.
Figure 4B:
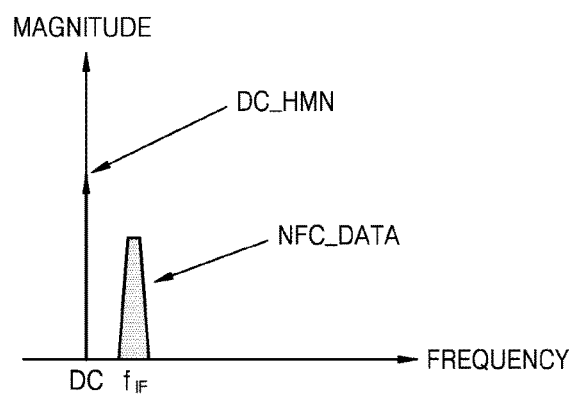
Figure 4C:
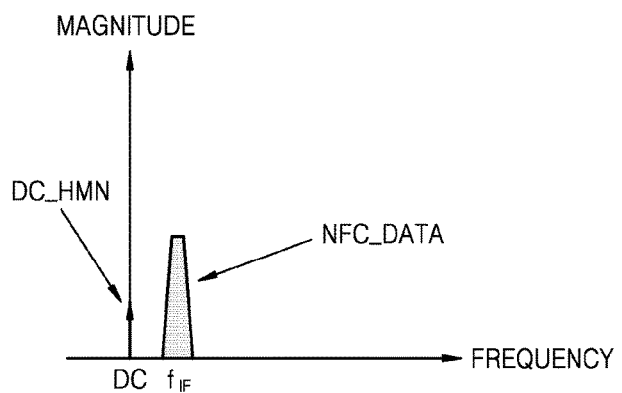

FIGS. 4A through 4C illustrate a frequency spectrum of each signal when one of the harmonics of an interference signal has the same frequency as a frequency for communication of an NFC receiver, according to an exemplary embodiment. For example, FIG. 4A illustrates an input spectrum of a mixer; FIG. 4B illustrates an output spectrum of the mixer; and FIG. 4C illustrates an output spectrum of a filter.

In FIG. 4A, a frequency spectrum of a plurality of harmonics HMN of an interference signal NS and a data signal NFC_DATA are illustrated. According to an aspect of an exemplary embodiment, the frequency spectrums may be those of the interference signal NS and the data signal NFC_DATA, the magnitudes of which, are adjusted in the first adjustment operation (S20 of FIG. 2B). The interference signal NS and the data signal NFC_DATA may have magnitudes that are adjusted in the first adjustment operation such that linearity is maintained during signal processing on the interference signal NS and the data signal NFC_DATA in the frequency down-conversion operation (S30 of FIG. 2B), the filtering operation (S40 of FIG. 2B), or the second adjustment operation (S50 of FIG. 2B).

The data signal NFC_DATA may form a spectrum symmetrically on each of the two sides with respect to a frequency $f_{NFC}$ for communication of the NFC receiver 100 (see FIG. 2A). The frequency $f_{NFC}$ for communication of the NFC receiver 100 may be a carrier frequency of the data signal NFC_DATA.

The harmonics HMN of the interference signal NS may have greater amplitude than the data signal NFC_DATA. The interference signal NS may be, for example, a wireless power transmission signal output from a wireless power transmission system. Among the harmonics HMN of the interference signal NS, an N-th harmonic $N \cdot f_{WPT}$ may have the same frequency as the frequency $f_{NFC}$ for communication of the NFC receiver 100. N may be any natural number.

In FIG. 4B, a frequency spectrum of a harmonic DC_HMN with respect to an interference signal and a data signal NFC_DATA that are separated from each other in a frequency domain is illustrated. According to an aspect of an exemplary embodiment, the illustrated frequency spectrums may be those of the interference signal NS and the data signal NFC_DATA, the frequencies of which are down-converted in the frequency down-conversion operation (S30 of FIG. 2B).

The frequency down-conversion operation (S30 of FIG. 2B) may be performed using the mixer 120 (see FIG. 2B). According to an aspect of an exemplary embodiment, the mixer 120 may mix the data signal NFC_DATA and the interference signal NS with a local oscillation signal Lo to perform frequency down-conversion on the data signal NFC_DATA and the interference signal NS.

The local oscillation signal Lo may have a frequency $f_{NFC}$ for communication of the NFC receiver 100 (see FIG. 2B). When an N-th harmonic $N \cdot f_{WPT}$ of the interference signal NS is the same as the frequency $f_{NFC}$ for communication of the NFC receiver 100, an output signal of the mixer 120 regarding the interference signal NS may include a DC component DC_HMN. The output signal of the mixer 120 regarding the data signal NFC_DATA may have a frequency component in a band-pass form carried on a sub-carrier frequency (or an intermediate frequency $f_{IF}$). According to another embodiment, the data signal NFC_DATA may be output as a baseband signal by the mixer 120.

In FIG. 4C, a frequency spectrum of the filtered data signal NFC_DATA and the interference signal NS is illustrated. According to an aspect of an exemplary embodiment, the frequency spectrum may be a frequency spectrum of the data signal NFC_DATA from which the interference signal NS is removed in the filtering operation S40.

The filtering operation (S40) may also be performed using the filter 130 of FIG. 2A. According to an aspect of an exemplary embodiment, the filtering operation S40 may be performed using a high pass filter. For example, a high pass filter may remove a DC component DC_HMN included in an output signal of the mixer 120, and pass the data signal NFC_DATA. According to another embodiment, the filtering operation (S40) may also be performed using a band pass filter.

Figure 5A:
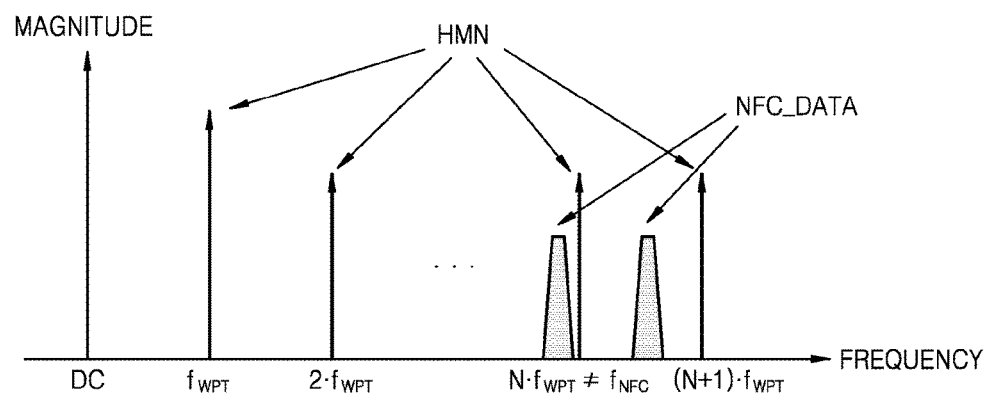
FIGS. 5A through 5C illustrate a frequency spectrum of each signal when one of the harmonics of an interference signal has a different frequency from a frequency for communication of an NFC receiver, according to an exemplary embodiment.
Figure 5B:
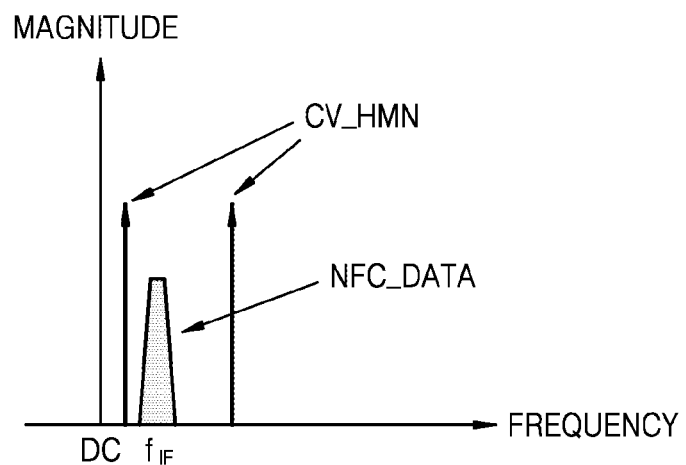
Figure 5C:
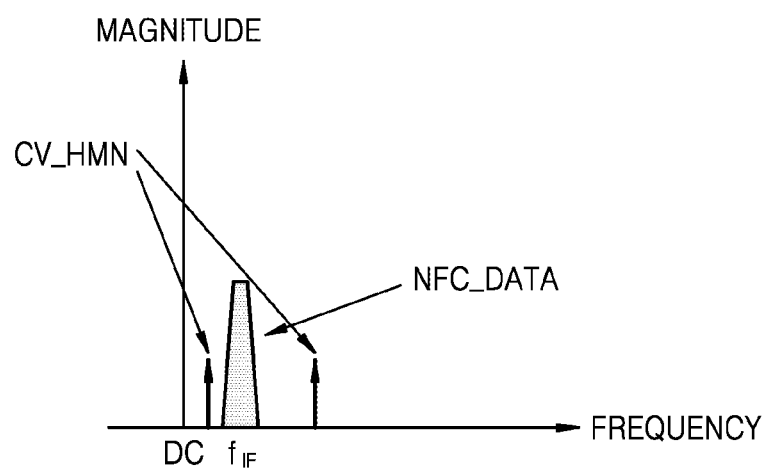

FIGS. 5A through 5C illustrate a frequency spectrum of each signal when one of the harmonics of an interference signal has a different frequency from a frequency for communication of an NFC receiver, according to an aspect of an embodiment of the present disclosure. For example, FIG. 5A may be an input spectrum of a mixer; FIG. 5B may be an output spectrum of the mixer; and FIG. 5C may be an output spectrum of a filter. Description provided above with reference to FIGS. 4A through 4C and also applied to the present exemplary embodiment will be omitted.

In FIG. 5A, frequency spectrums of a plurality of harmonics HMN of an interference signal NS and a data signal NFC_DATA are illustrated. According to an aspect of an exemplary embodiment, the frequency spectrums may be those of the interference signal NS and the data signal NFC_DATA, the magnitudes of which are adjusted in the first adjusting operation (S20 of FIG. 2B).

The data signal NFC_DATA may symmetrically form a spectrum on each of the two sides with respect to a frequency $f_{NFC}$ for communication of the NFC receiver 100 (see FIG. 2A). However, differently from FIG. 4A, each of the harmonics HMN of the interference signal NS may have a different frequency from the frequency $f_{NFC}$ for communication of the NFC receiver 100. The harmonics HMN of the interference signal NS may have greater amplitude than the data signal NFC_DATA. The interference signal NS may be, for example, a wireless power transmission signal output from a wireless power transmission system.

In FIG. 5B, frequency spectrums of harmonics CV_HMN with respect to an interference signal NS and a data signal NFC_DATA that are separated from each other in a frequency domain are illustrated. According to an aspect of an exemplary embodiment, the illustrated frequency spectrums may be those of the interference signal NS and the data signal NFC_DATA, the frequencies of which are down-converted in the frequency down-conversion operation (S30 of FIG. 2B).

The frequency down-conversion operation (S30 of FIG. 2B) may be performed using the mixer 120 (see FIG. 2B). According to an aspect of an exemplary embodiment, the mixer 120 may mix the data signal NFC_DATA and the interference signal NS with a local oscillation signal Lo to perform frequency down-conversion on the data signal NFC_DATA and the interference signal NS.

The local oscillation signal Lo may have a frequency $f_{NFC}$ for communication of the NFC receiver 100 (see FIG. 2A). Unlike FIGS. 4A through 4C, each of the harmonics HMN of the interference signal NS is different from the frequency $f_{NFC}$ for communication of the NFC receiver 100, and thus, an output signal of the mixer 120 regarding the interference signal NS may be down-converted not into a DC component but into a frequency corresponding to, for example, a difference between a frequency of each of the harmonics HMN and a frequency of the local oscillation signal Lo. According to an exemplary embodiment, the harmonics CV_HMN of the interference signal NS, frequencies of which are down-converted, may exist both in low and high frequency domains of the data signal NFC_DATA that is frequency down-converted.

In FIG. 5C, frequency spectrums of the filtered data signal NFC_DATA and the interference signal NS are illustrated. According to an aspect of an exemplary embodiment, the frequency spectrum may be a frequency spectrum of the data signal NFC_DATA from which the interference signal NS is removed in the filtering operation S40.

The filtering operation (S40) may also be performed using the filter 130 of FIG. 2A. Unlike FIGS. 4A through 4C, the harmonics CV_HMN of the interference signal NS, the frequencies of which are down-converted, may exist both in low and high frequency domains of the data signal NFC_DATA that is frequency down-converted. Thus, according to an aspect of an exemplary embodiment, the filtering operation (S40) may be performed using a band pass filter. For example, a band pass filter may remove the harmonics CV_HMN included in an output signal of the mixer 120 with respect to the interference signal NS, and pass the data signal NFC_DATA.

Figure 6:
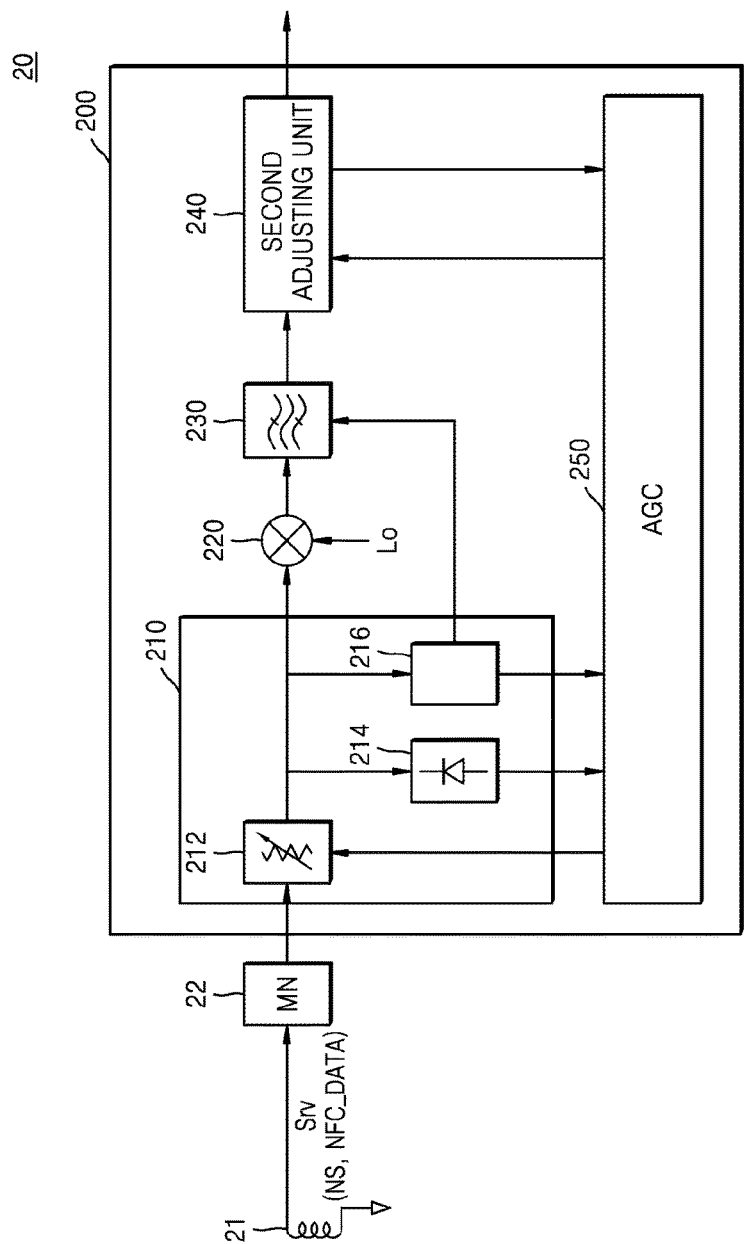
FIG. 6 is a detailed block diagram of an NFC circuit according to an exemplary embodiment.

FIG. 6 is a detailed block diagram of an NFC circuit 20 according to an exemplary embodiment.

As shown in FIG. 6, a first adjusting unit 210 included in the NFC circuit 20 may include a variable attenuator 212, a first power detector 214, and a frequency detector 216. Description of other blocks of the NFC circuit 20 provided above with respect to FIG. 3A will be omitted.

The variable attenuator 212 may attenuate a magnitude of a data signal NFC_DATA or an interference signal NS received through an antenna 21, based on a first attenuation value that is variable. The first attenuation value may be controlled using an AGC 250.

The first power detector 214 may detect power regarding a signal between the variable attenuator 212 and a mixer 220. The first power detector 214 may output power detection information regarding a signal between the variable attenuator 212 and the mixer 220 to the AGC 250.

The frequency detector 216 may be connected to the first power detector 214 in parallel so as to detect a frequency regarding a signal between the variable attenuator 212 and the mixer 220. The frequency detector 216 may include, for example, at least one reference clock generator used to compare between signals transmitted between the variable attenuator 212 and the mixer 220. The frequency detector 216 may output frequency detection information about a signal between the variable attenuator 212 and the mixer 220 to the AGC 250 and/or a filter 230. According to an aspect of an exemplary embodiment, the frequency detector 216 may be an independent block. According to another exemplary embodiment, the frequency detector 216 may be included in a phase-locked loop (PLL) that fixes a phase of a local oscillator.

The filter 230 may include a high pass filter and a band pass filter. According to an aspect of an exemplary embodiment, the filter 230 may receive frequency detection information about a signal between the variable attenuator 212 and the mixer 220 from the frequency detector 216. The filter 230 may select one of a high pass filter and a band pass filter to be used in filtering a data signal NFC_DATA, based on the frequency detection information. According to exemplary embodiment, the filter 230 may select a filter to be used, by receiving a filter selection control signal from the AGC 250 that has received frequency detection information.

The AGC 250 may control a first attenuation value of the first adjusting unit 210 by receiving a power and frequency detection information regarding a signal between the variable attenuator 212 and the mixer 220 from each of the first power detector 214 and the frequency detector 216. Specifically, the AGC 250 may compare power detection information output by the first power detector 214 and frequency detection information output by the frequency detector 216, with values included in a table, and control a first attenuation value based on a result of determining whether linearity is maintained in signal processing.

Figure 7:
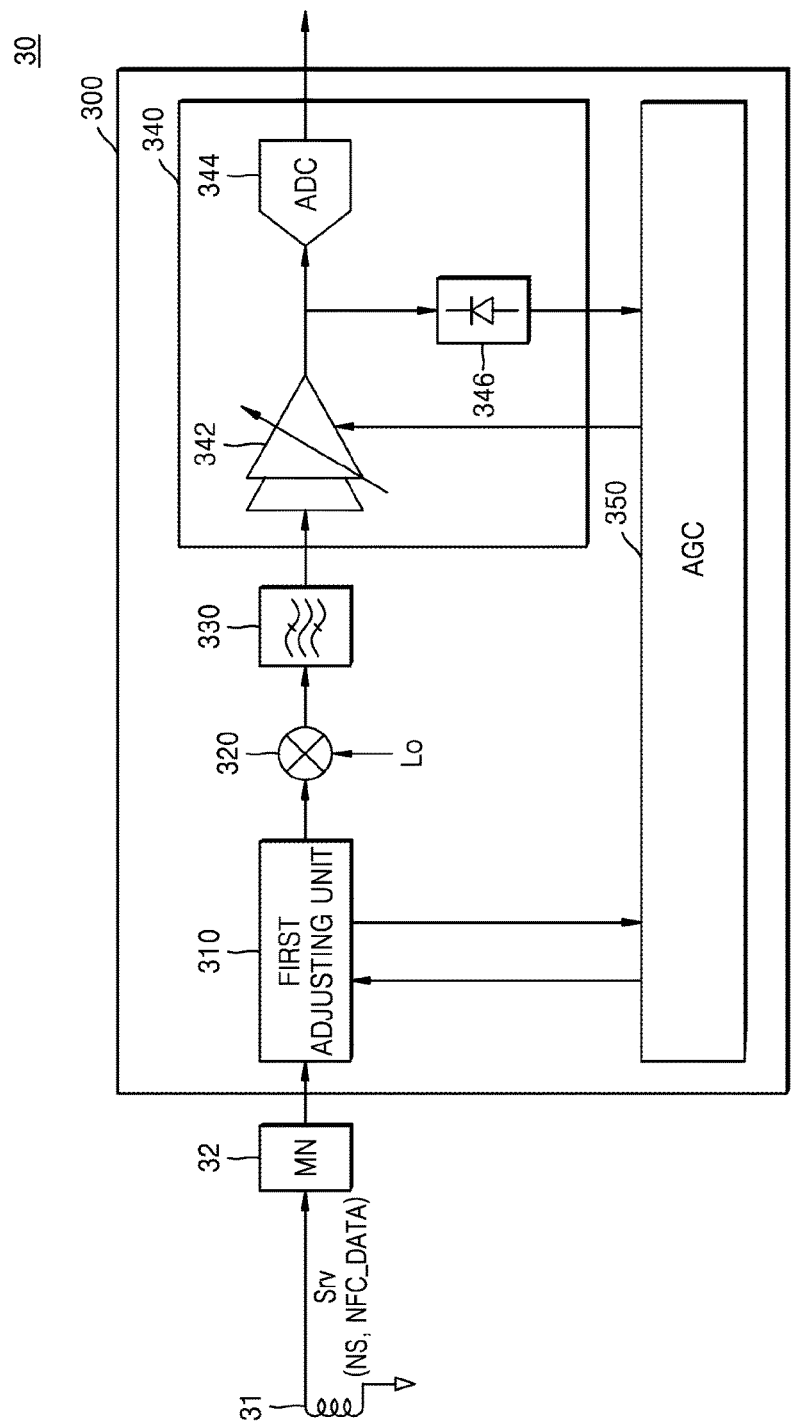
FIG. 7 is a detailed block diagram of an NFC circuit according to an exemplary embodiment.

FIG. 7 is a detailed block diagram of an NFC circuit 30 according to an exemplary embodiment.

As shown in FIG. 7, a second adjusting unit 340 included in the NFC circuit 30 may include a variable gain amplifier 342, an analog-to-digital converter 344, and a second power detector 346. Description of other blocks of the NFC circuit 30 provided above with respect to FIG. 3A will be omitted.

The variable gain amplifier 342 may amplify or attenuate a data signal NFC_DATA filtered using a filter 330, based on a first gain value. The first gain value may be controlled using an AGC 350. The analog-to-digital converter 344 may perform analog-to-digital conversion on the amplified or attenuated data signal NFC_DATA based on the first gain value.

The second power detector 346 may detect power regarding a signal between the variable gain amplifier 342 and the analog-to-digital converter 344. A signal, power of which is detected using the second power detector 346, may be an analog signal. The second power detector 346 may include, for example, a plurality of current conversion circuits, and may combine a plurality of currents from the plurality of current conversion circuits so as to determine an output voltage. The second power detector 346 may output power detection information about a signal between the variable gain amplifier 342 and the analog-to-digital converter 344 to the AGC 350.

Figure 8:
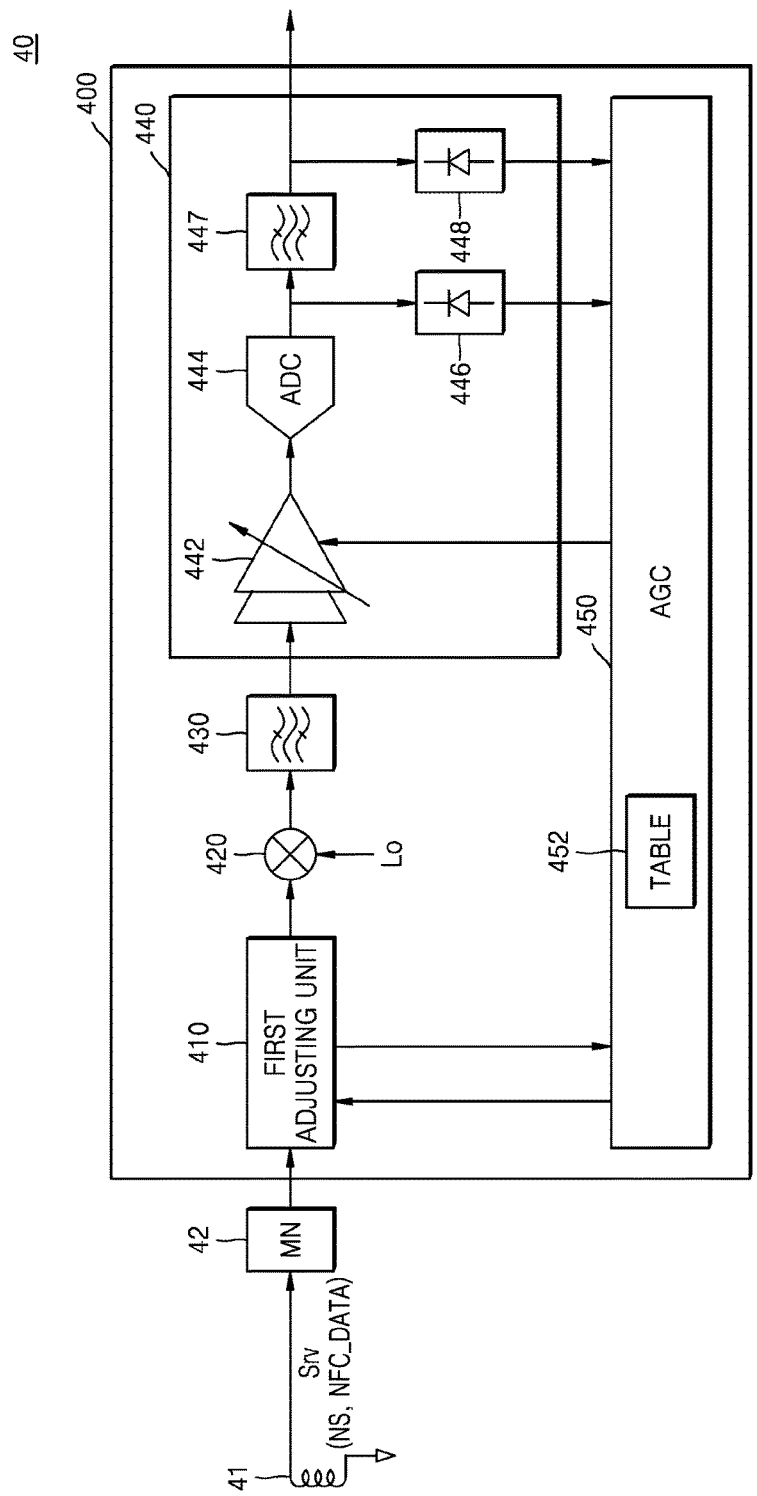
FIG. 8 is a detailed block diagram of an NFC circuit according to an exemplary embodiment.

FIG. 8 is a detailed block diagram of an NFC circuit 40 according to an exemplary embodiment.

As shown in FIG. 8, a second adjusting unit 440 included in the NFC circuit 40 may include a variable gain amplifier 442, an analog-to-digital converter 444, a second power detector 446, a digital filter 447, and a third power detector 448. Description of other blocks of the NFC circuit 40 provided above with respect to FIG. 3A will be omitted.

An AGC 450 may control a first gain value based on power detection information of the second power detector 446. The variable gain amplifier 442 may amplify or attenuate a data signal NFC_DATA based on the controlled first gain value, such that the data signal NFC_DATA is normally demodulated, and the analog-to-digital converter 444 may convert the amplified or attenuated data signal NFC_DATA into a digital signal.

The data signal NFC_DATA that is converted into a digital signal may be input to the digital filter 447 to be filtered. According to an aspect of an exemplary embodiment, the digital filter 447 may be a band pass filter. The digital filter 447 may remove, for example, other signals converted into digital signals, besides the data signal NFC_DATA.

The third power detector 448 may detect power regarding an output signal filtered using the digital filter 447. The third power detector 448 may have the same configuration as, for example, the second power detector 446. The third power detector 448 may output power detection information with respect to the output signal of the digital filter 447 to the AGC 450.

The AGC 450 may control a first gain value based on the power information detected using the third power detector 448. For example, if the data signal NFC_DATA is attenuated so much that the data signal NFC_DATA is not able to be normally demodulated through filtering in the digital filter 447, the AGC 450 may control the first gain value such that the data signal NFC_DATA is normally demodulated. According to an exemplary embodiment, the AGC 450 may control the first gain value by comparing the power information detected from the third power detector 448 with values included in a first table 452.

Figure 9:
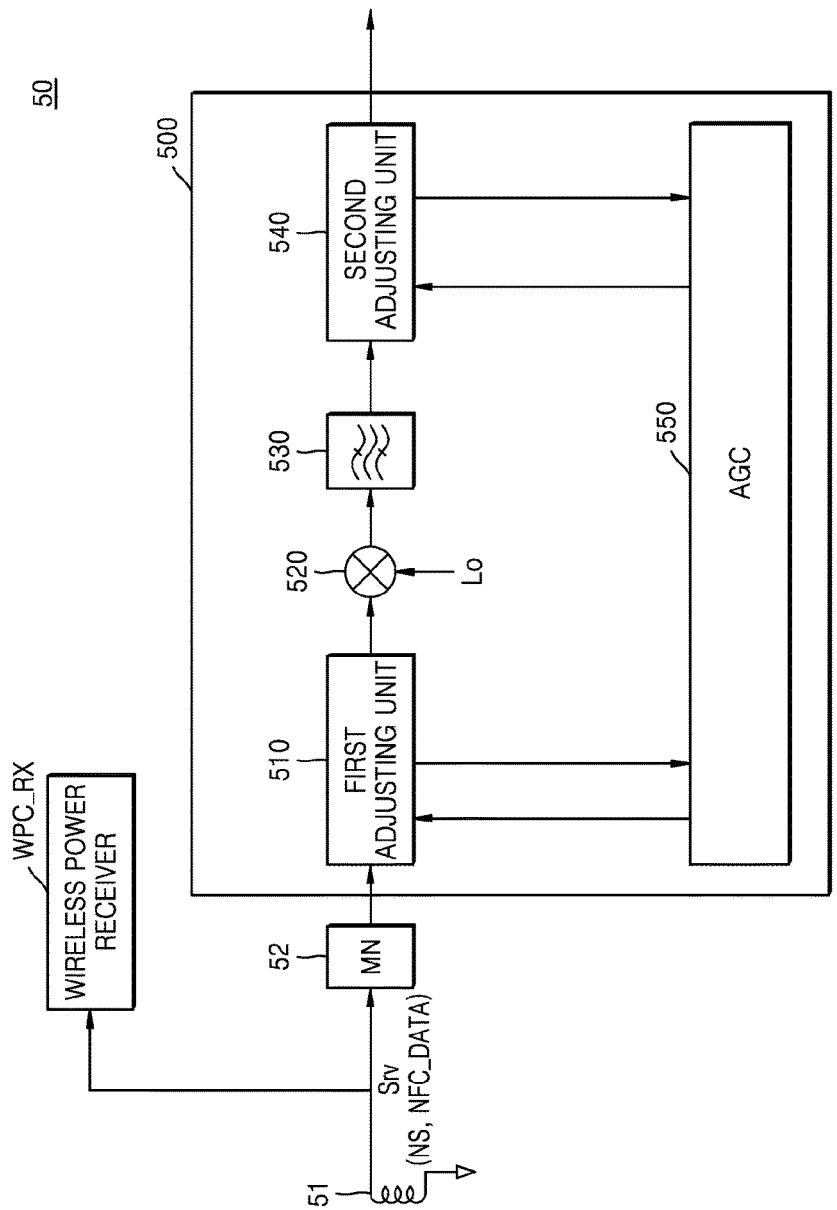
FIG. 9 is a detailed block diagram of an NFC circuit according to an exemplary embodiment.

FIG. 9 is a detailed block diagram of an NFC circuit 50 according to an exemplary embodiment.

As shown in FIG. 9, the NFC circuit 50 may further include a wireless power receiver WPC_Rx. A matching network 52 and an NFC receiver 500 may be connected to the wireless power receiver WPC_Rx in parallel through an antenna 51. Description of other blocks of the NFC circuit 50 provided above with respect to FIG. 3A will be omitted.

The wireless power receiver WPC_Rx may receive power wirelessly from a wireless power transmitter that is located at a predetermined distance away from the wireless power receiver WPC_Rx, without physical contact therebetween, by using at least one wireless power transmission method. The wireless power receiver WPC_Rx may receive power from a wireless power transmitter by using at least one of an inductive coupling method performed based on magnetic induction via a wireless power transmission signal and a magnetic resonance coupling method performed based on electromagnetic resonance via a wireless power transmission signal of a predetermined frequency.

The antenna 51 may receive an external signal such as a wireless power transmission signal transmitted by a wireless power transmitter, a data signal NFC_DATA from an external NFC circuit or an NFC tag, or a first signal including a wireless power transmission signal and a data signal NFC_DATA, and convert the external signal into an electric signal Srv. The antenna 51 may convert the external signal into an electric signal Srv and transmit the same to the wireless power receiver WPC_Rx or the matching network 52.

When receiving a first signal including a wireless power transmission signal and a data signal NFC_DATA, the wireless power transmission signal may act as an interference signal NS with respect to the NFC receiver 500. A wireless power transmission signal may be, for example, a signal having a greater magnitude than a data signal NFC_DATA. A wireless power transmission signal may include a plurality of harmonics. According to an aspect of an exemplary embodiment, one of the harmonics of the wireless power transmission signal may have the same frequency as that for communication of the NFC receiver 500. According to an aspect of an exemplary embodiment, harmonics of the wireless power transmission signal may each have a different frequency from that for communication of the NFC receiver 500.

According to an aspect of an exemplary embodiment, when receiving a first signal including a wireless power transmission signal and a data signal NFC_DATA, the wireless power receiver WPC_Rx and the NFC receiver 500 may operate simultaneously with respect to the first signal. Specifically, the wireless power receiver WPC_Rx may generate output power through a wireless power transmission signal included in the first signal, and the NFC receiver 500 may receive the first signal and perform thereon operation S20, operation S30, operation S40, and operation S50, as described above with reference to FIG. 2B.

Figure 10:
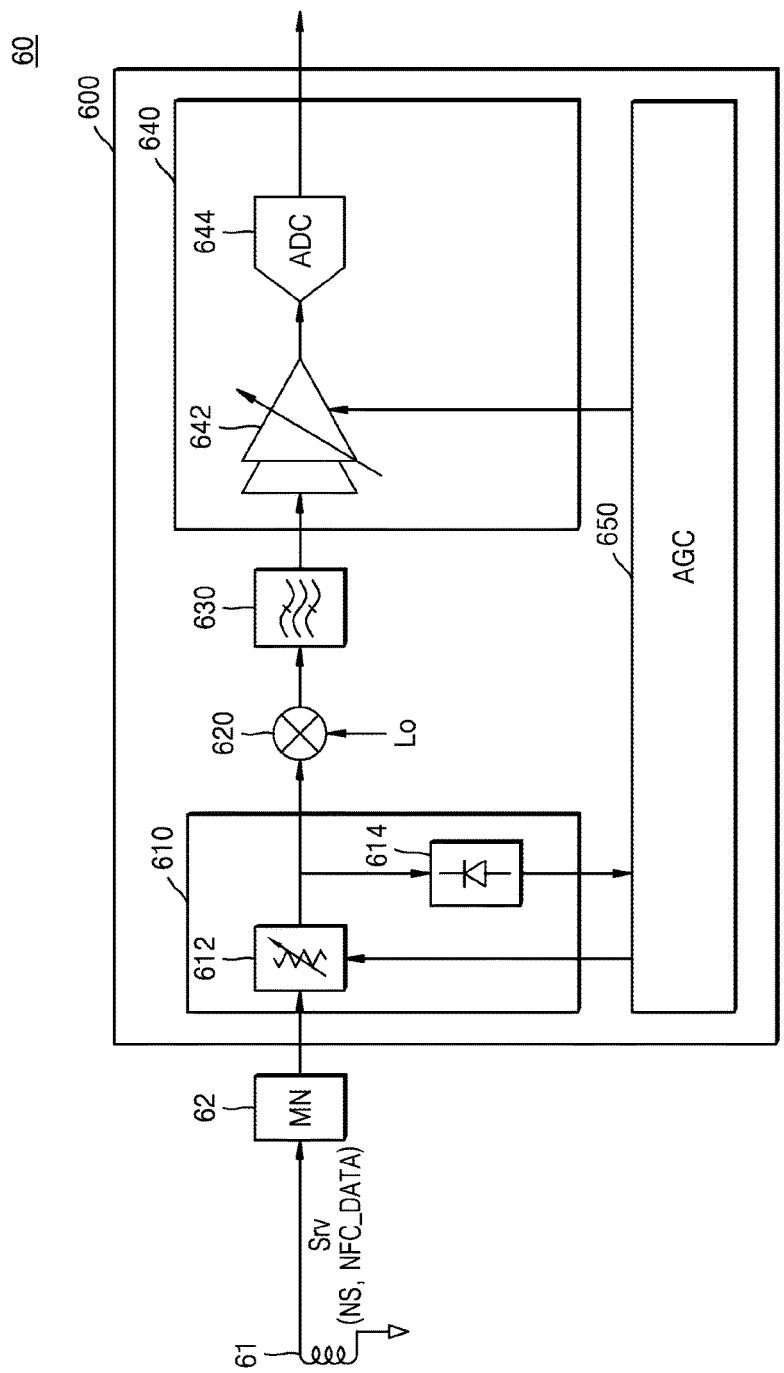
FIG. 10 is a detailed block diagram of an NFC circuit according to an exemplary embodiment.

FIG. 10 is a detailed block diagram of an NFC circuit 60 according to an exemplary embodiment.

FIG. 10 illustrating the NFC circuit 60 is similar to FIG. 3A illustrating the NFC circuit 10. However, while the second adjusting unit 140 of FIG. 3A includes the second power detector 146 detecting power with respect to an output signal converted into a digital signal, by using the analog-to-digital converter 144, a second adjusting unit 640 in FIG. 10 may not include the second power detector 146.

In this case, a first gain value used to amplify or attenuate a data signal NFC_DATA filtered using a filter 630 may be adjusted by using a first attenuation value. Specifically, after the first attenuation value is adjusted using a first adjusting unit 610, the first gain value may be inversely compensated based on an amount that the first attenuation value is adjusted. For example, if the first attenuation value is increased by an amount X by using the first adjusting unit 610, the first gain value may increase by the amount X. According to an aspect of an exemplary embodiment, adjustment of the first gain value, which is based on the first attenuation value, may be performed by an AGC 650.

Figure 11:
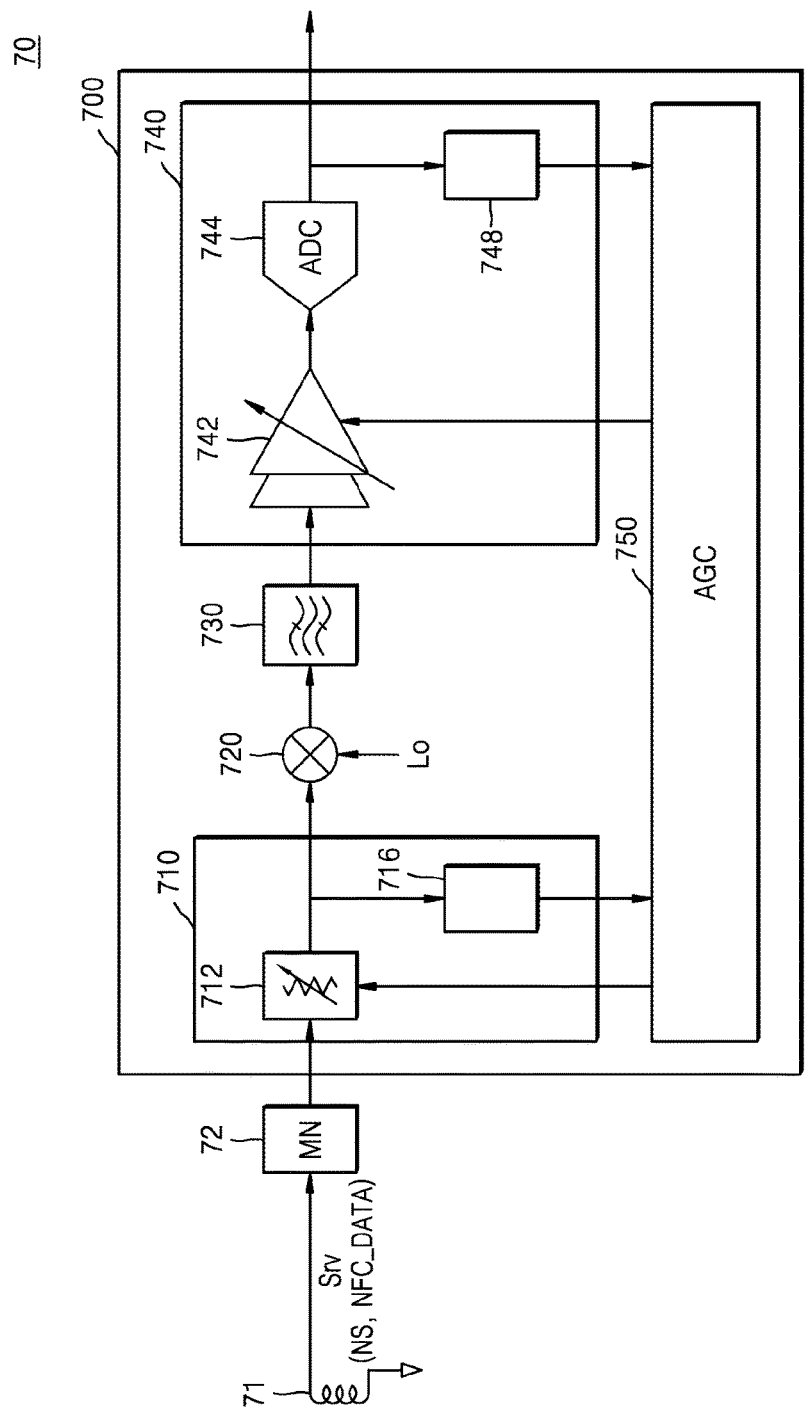
FIG. 11 is a detailed block diagram of an NFC circuit according to an exemplary embodiment.

FIG. 11 is a detailed block diagram of an NFC circuit 70 according to an exemplary embodiment.

FIG. 11 illustrating the NFC circuit 70 is similar to FIG. 3A illustrating the NFC circuit 10. However, while the first adjusting unit 110 and the second adjusting unit 140 of FIG. 3A respectively include the first power detector 114 and the second power detector 146, which respectively detect magnitude information of the data signal NFC_DATA and/or the interference signal NS and output the same to the AGC 150, in FIG. 11, instead of the first power detector 114 and the second power detector 146, a first adjusting unit 710 and a second adjusting unit 740 may respectively include a first frequency detector 716 and a second frequency detector 748.

In this case, an AGC 750 may control a first attenuation value and a first gain value based on outputs of the first frequency detector 716 and the second frequency detector 748. According to an aspect of an exemplary embodiment, the first frequency detector 716 may detect whether an interference signal NS exists in an electric signal Srv input from an antenna 71 and provide information on the existence of the interference signal NS to the AGC 750. When it is determined that the interference signal NS exists, the AGC 750 may set an initial value with respect to the first gain value, and the second frequency detector 748 may determine whether the interference signal NS exists in an output of an analog-to-digital converter 744, and provide information on the existence of the interference signal NS to the AGC 750. According to an aspect of an exemplary embodiment, an initial value with respect to the first gain value may be set to a predetermined value by considering signal linearity in a signal processing operation performed by the analog-to-digital converter 744 and the second frequency detector 748.

The AGC 750 may receive, from the second frequency detector 748, information about whether the interference signal NS exists, and control the interference signal NS so as to increase the first attenuation value until the interference signal NS is no longer detected by the second frequency detector 748. When the interference signal NS is no longer detected by the second frequency detector 748 as the first attenuation value has increased, the first gain value may be inversely compensated based on an amount that the first attenuation value is increased. According to an aspect of an exemplary embodiment, adjustment of the first gain value, which is based on the first attenuation value, may be performed by the AGC 750.

Figure 12:
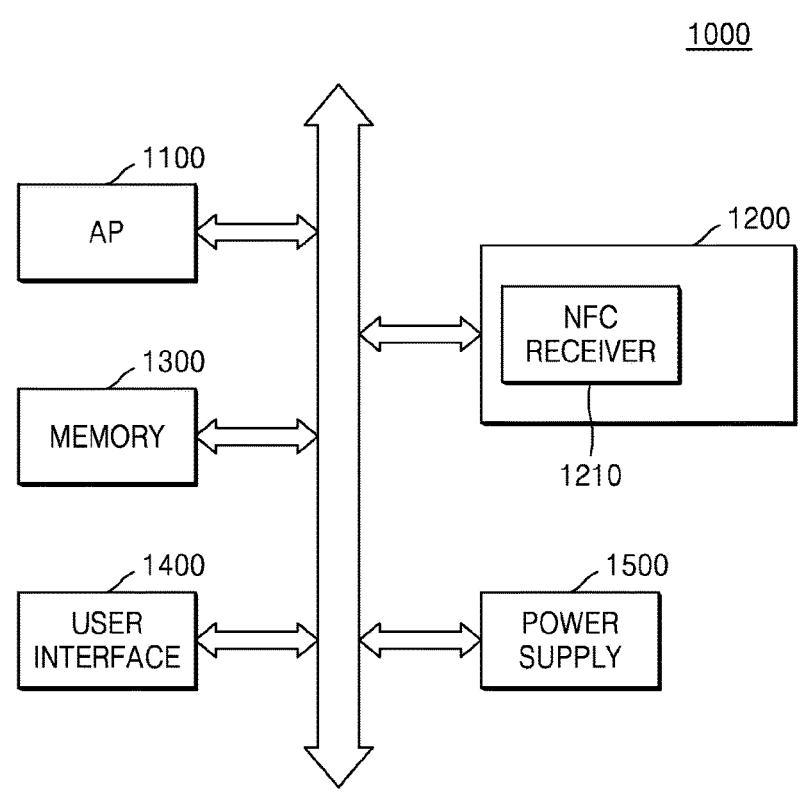
FIG. 12 is a block diagram illustrating an electronic system according to an exemplary embodiment.

FIG. 12 is a block diagram illustrating an electronic system 1000 according to an exemplary embodiment.

As shown in FIG. 12, the electronic system 1000 may include an application processor 1100, an NFC device 1200, a memory device 1300, a user interface 1400, and a power supply 1500. The electronic system 1000 may be a mobile system such as a mobile phone, a smartphone, a personal digital assistant (PDA), a portable multimedia player (PMP), a digital camera, a music player, a portable game console, a navigation system, or a laptop computer.

The application processor 1100 may control overall operations of the electronic system 1000. The application processor 1100 may execute applications providing, for example, an internet browser, a game, or a video. The application processor 1100 may include a single core processor or multi-core processor.

The memory device 1300 may store data needed for operation of the electronic system 1000. The memory device 1300 may store, for example, a boot image for booting the electronic system 1000, and store output data to be transmitted to an external device and received input data.

The NFC device 1200 may transmit output data stored in the memory device 1300 in an external device and receive input data from an external device in the memory device 1300, via NFC communication. The NFC device 1200 may include an NFC receiver 1210 according to various exemplary embodiments of the present disclosure. That is, if an interference signal exists during NFC communication, the electronic system 1000 may minimize mutual interference and performance degradation due to the interference signal.

While the exemplary embodiments of the present disclosure have been particularly shown with reference to embodiments thereof and the drawings, without intents other than the intent for providing a thorough understanding of the present disclosure to one of ordinary skill in the art, they should be understood as not limiting the present disclosure. In addition, it will be understood that various changes in form and details may be made therein without departing from the spirit and scope of the following claims.

What is claimed is:

1. A method of operating a near-field communication (NFC) circuit, the method comprising:
receiving an interference signal and a data signal through an antenna;
adjusting magnitudes of the received interference signal and the received data signal;
down-converting frequencies of the interference signal and the data signal;
filtering the data signal by removing the frequency down-converted interference signal; and
adjusting a magnitude of the filtered data signal,
wherein the adjusting the magnitudes of the received interference signal and the received data signal comprises adjusting the magnitudes of the interference signal and the data signal such that linearity of the data signal is maintained during signal processing performed on the interference signal and the data signal in the down-converting of the frequencies of the interference signal and the data signal, the filtering of the data signal, and the adjusting of the magnitude of the filtered data signal,
wherein the adjusting the magnitude of the filtered data signal further comprises:
adjusting, at a first time, the magnitude of the filtered data signal based on a first gain value;
performing, at a second time later than the first time, analog to digital conversion of the data signal having the adjusted magnitude;

detecting a magnitude of the data signal on which the analog-to-digital conversion is performed; and adjusting the first gain value in response to a determination that the data signal having the detected magnitude cannot be demodulated without saturation.

2. The method of claim 1, wherein the interference signal comprises a wireless power transmission signal output from a wireless power transmission system.

3. The method of claim 1, wherein the down-converting the frequencies of the interference signal and the data signal comprises converting a frequency of the data signal to an intermediate frequency (IF).

4. The method of claim 1, wherein the adjusting of the magnitudes of the received interference signal and the received data signal comprises:

attenuating the magnitudes of the received interference signal and the received data signal based on a first attenuation value;

detecting the attenuated magnitudes of the interference signal and the data signal; and in response to a determination based on the detected attenuated magnitudes that the linearity is not maintained, adjusting the first attenuation value.

5. The method of claim 4, wherein the detecting of the attenuated magnitudes comprises detecting power of at least one of the interference signal and the data signal.

6. The method of claim 1, wherein the frequencies of the interference signal and the data signal are down-converted based on a local oscillation signal having a frequency for communication of the NFC circuit.

7. The method of claim 1, wherein the filtering the data signal comprises, in response to at least one of a plurality of harmonics of the interference signal having a same frequency as a frequency for communication of the NFC circuit, performing high pass filtering on the data signal.

8. The method of claim 1, wherein the filtering the data signal comprises, in response to each of a plurality of harmonics of the interference signal having a different frequency from a frequency for communication of the NFC circuit, performing band pass filtering on the data signal.

9. The method of claim 1, wherein the adjusting the magnitude of the filtered data signal comprises adjusting the magnitude of the filtered data signal such that the filtered data signal has a magnitude sufficient for demodulating without saturation.

10. The method of claim 9, wherein the adjusting the magnitude of the filtered data comprises one of amplifying the magnitude of the filtered data and attenuating the magnitude of the filtered data.

11. The method of claim 10, wherein the detecting the magnitude of the analog-to-digital converted data signal comprises detecting power of the analog-to-digital converted data signal.

12. A method of operating a near-field communication (NFC) circuit, the method comprising:

receiving a first signal including an interference signal or a modulated data signal through an antenna;

attenuating a magnitude of the received first signal;

down-converting a frequency of the first signal having the attenuated magnitude based on a local oscillation signal having a frequency for communication of the NFC circuit;

filtering the modulated data signal included in the frequency down-converted first signal; and adjusting a magnitude of the filtered data signal, wherein the attenuating the magnitude of the received first signal comprises attenuating the magnitude of the first signal such that linearity of the modulated data signal is maintained in signal processing performed on the first signal in the down-converting of the frequency of the first signal, the filtering of the modulated data signal, and the adjusting of the magnitude of the filtered data signal, and wherein the adjusting the magnitude of the filtered data signal comprises adjusting the magnitude of the filtered data signal such that the filtered data signal has a sufficient magnitude for demodulating without saturation, wherein the adjusting the magnitude of the filtered data signal further comprises:

adjusting, at a first time, the magnitude of the filtered data signal based on a first gain value;

performing, at a second time later than the first time, analog to digital conversion of the data signal having the adjusted magnitude;

detecting a magnitude of the data signal on which the analog-to-digital conversion is performed; and adjusting the first gain value in response to a determination that the data signal having the detected magnitude cannot be demodulated without saturation.

13. The method of claim 12, wherein the attenuating the magnitude of the received first signal further comprises:

attenuating the magnitude of the received first signal based on a first attenuation value;

detecting the attenuated magnitude of the attenuated first signal and a frequency of the attenuated first signal; and adjusting the first attenuation value in response to a determination, based on one of the detected attenuated magnitude and the frequency of the first signal, that the linearity is not maintained.

14. A near-field communication (NFC) receiver performing communication through an antenna, the NFC receiver comprising:

a first adjusting unit configured to receive a data signal or an interference signal through the antenna, and attenuate a magnitude of the data signal or the interference signal based on a first attenuation value;

a mixer configured to down-convert a frequency of the data signal or the interference signal output by the first adjusting unit;

a filter configured to filter the data signal from the data signal or the interference signal output by the mixer;

a second adjusting unit configured to receive the filtered data signal and adjust a magnitude of the data signal based on a first gain value; and an automatic gain controller (AGC) configured to adjust the first attenuation value based on the magnitude of the data signal or the interference signal that is attenuated using the first adjusting unit, and to adjust the first gain value based on the magnitude of the data signal that is adjusted using the second adjusting unit, wherein adjusting the magnitude of the data signal comprises one of amplifying the magnitude of the data signal and attenuating the magnitude of the data signal, and wherein the second adjusting unit comprises:

a variable gain amplifier configured to receive the filtered data signal and adjust the data signal based on the first gain value, adjusting the data signal comprising one of amplifying the data signal and attenuating the data signal;

an analog-to-digital converter configured to receive an output signal of the variable gain amplifier and perform analog-to-digital conversion on the output signal to output the analog-to-digital converted signal.

15. The NFC receiver of claim 14, wherein the first adjusting unit comprises:
a variable attenuator configured to receive the data signal or the interference signal and attenuate the magnitude of the data signal or the interference signal based on the first attenuation value; and
a first power detector configured to detect power of an output signal of the variable attenuator.

16. The NFC receiver of claim 14, wherein the second adjusting unit further comprises:
a second power detector configured to detect power of the output signal of the analog-to-digital converter.

17. The NFC receiver of claim 14, wherein the AGC comprises a first table,
wherein the first attenuation value is further adjusted based on the first table in addition to the magnitude of the data signal or the interference signal attenuated by the first adjusting unit, and
wherein the first gain value is further adjusted based on the first table and the magnitude of the data signal adjusted by the second adjusting unit.

18. The NFC receiver of claim 14, wherein the NFC receiver is connected in parallel to a wireless power receiver operating based on a wireless power transmission signal received from an outside of the NFC receiver, through the antenna.

19. The NFC receiver of claim 14, wherein the NFC receiver receives the data signal or the interference signal via a matching network connected between the antenna and the NFC receiver.

* * * * *